(12) United States Patent
Thrasher et al.

(10) Patent No.: US 10,900,848 B2
(45) Date of Patent: *Jan. 26, 2021

(54) ARTICLES COMPRISING A RESISTOR COMPRISING CORE SHELL LIQUID METAL ENCAPSULATES AND METHOD OF DETECTING AN IMPACT

(71) Applicant: Government of the United States, as represented by the Secretary of the Air Force, Wright-Patterson AFB, OH (US)

(72) Inventors: Carl J. Thrasher, Beavercreek, OH (US); Christopher E. Tabor, Kettering, OH (US); Zachary J. Farrell, Xenia, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/580,548

(22) Filed: Sep. 24, 2019

(65) Prior Publication Data

US 2020/0141820 A1 May 7, 2020

Related U.S. Application Data

(60) Provisional application No. 62/754,631, filed on Nov. 2, 2018.

(51) Int. Cl.
*G01L 5/00* (2006.01)
*G01L 1/20* (2006.01)
(Continued)

(52) U.S. Cl.
CPC ............. *G01L 1/20* (2013.01); *G01L 5/0052* (2013.01); *G01R 27/22* (2013.01); *H01L 23/06* (2013.01)

(58) Field of Classification Search
CPC ......... G01L 1/20; G01L 5/0052; G01R 27/22; H01L 23/06
(Continued)

(56) References Cited

U.S. PATENT DOCUMENTS

| 5,198,189 A | 3/1993 | Booth et al. |
| 7,491,892 B2 | 2/2009 | Wagner et al. |

(Continued)

FOREIGN PATENT DOCUMENTS

| JP | H11220182 A | 8/1999 |
| KR | 101687371 B1 | 12/2016 |

(Continued)

OTHER PUBLICATIONS

Machine Translation of JPH11220182A, Yasunori et al. Publication Date Aug. 10, 1999.

(Continued)

*Primary Examiner* — Max H Noori
(74) *Attorney, Agent, or Firm* — AFMCLO/JAZ; James F McBride

(57) ABSTRACT

Articles and methods of detecting an impact on an article using a resistor containing core shell liquid metal encapsulates are disclosed. Such core shell liquid metal encapsulates enable simple but robust impact sensors as such encapsulates comprise a highly electrically resistant metal oxide shell that prevents such encapsulates from coalescing. Yet when such shell is ruptured, the highly conductive bulk liquid metal is released. Such liquid metal changes electrical (Continued)

properties of a sensor comprising core shell liquid metal encapsulates which in turn is evidence of the aforementioned impact.

21 Claims, 1 Drawing Sheet

(51) Int. Cl.
  *H01L 23/06* (2006.01)
  *G01R 27/22* (2006.01)
(58) Field of Classification Search
  USPC .................................................. 73/862.625
  See application file for complete search history.

(56) References Cited

U.S. PATENT DOCUMENTS

| | | | |
|---|---|---|---|
| 9,859,226 | B1 | 1/2018 | Campbell et al. |
| 9,930,773 | B2 | 3/2018 | Holbery et al. |
| 2003/0215394 | A1 | 11/2003 | Short et al. |
| 2005/0284232 | A1 | 12/2005 | Rice |
| 2008/0277631 | A1 | 11/2008 | Smela et al. |
| 2013/0244037 | A1 | 9/2013 | Hohman et al. |
| 2014/0147959 | A1 | 5/2014 | Ratcurt et al. |
| 2016/0049227 | A1 | 2/2016 | Bottiglio et al. |
| 2016/0218287 | A1 | 7/2016 | McAlpine et al. |
| 2017/0089774 | A1 | 3/2017 | Rykaczewski et al. |
| 2017/0218167 | A1 | 8/2017 | Majidi et al. |
| 2017/0235021 | A1 | 8/2017 | Boley et al. |
| 2018/0029290 | A1 | 2/2018 | Bottiglio et al. |
| 2018/0043656 | A1* | 2/2018 | Song ...................... B32B 27/20 |
| 2020/0139329 | A1* | 5/2020 | Tabor ..................... H01Q 1/364 |
| 2020/0143955 | A1* | 5/2020 | Thrasher ............... G06F 21/554 |
| 2020/0146142 | A1* | 5/2020 | Thrasher .................. H05K 1/09 |
| 2020/0211928 | A1* | 7/2020 | Parekh .................. H01L 23/473 |

FOREIGN PATENT DOCUMENTS

| | | |
|---|---|---|
| WO | WO2013044226 A2 | 3/2013 |
| WO | WO2015073944 A2 | 5/2015 |
| WO | WO2017072347 A1 | 5/2017 |
| WO | WO2017151523 A1 | 9/2017 |

OTHER PUBLICATIONS

Machine Translation of KR101687371 B1, Kyoo et al. Publication Date Dec. 16, 2016.

Bartlett, Michael D.; Fassler, Andrew; Kazem, Navid; Markvicka, Eric J.; Mandal, Pratiti; Majidi, Carmel; Stretchable, High-k Dielectric Elastomers through Liquid-Metal Inclusions. Adv. Mater. 2016, 28, 3726-3731.

Wagner, Sigurd; Bauer, Siegfried; Materials for stretchable electronics. MRS Bulletin, 2012, 37, 207-213.

Xu, Feng; Zhu, Yong; Highly conductive and stretchable silver nanowire conductors. Adv. Mater. 2012, 24, 5117-5122.

Liu, Z. F.; Fang, S.; Moura, F. A.; Ding, J. N.; Jiang, N.; Di, J.; Zhang, M.; Lepro, X.; Galvao, D. S.; Haines, C. S.; Yuan, N. Y.; Yin, S. G.; Lee, D. W.; Wang, R.; Wang, H. Y.; Lv, W.; Dong, C.; Zhang, R. C.; Chen, M. J.; Yin, Q.; Chong, Y. T.; Zhang, R; Wang, X.; Lima, M. D.; Ovalle-Robles, R.; Qian, D.; Lu, H.; Baughman, R. H.; Hierarchically buckled sheath-core fibers for superelastic electronics, sensors, and muscles. Science 2015, 349, 6246, 400-404.

Wang, Jiangxin; Cai, Guofa; Li, Shaohui; Gao, Dace; Xiong, Jiaqing; Lee, Pooi See; Printable Superelastic Conductors with Extreme Stretchability and Robust Cycling Endurance Enabled by Liquid-Metal Particles. Adv. Mater. 2018, 30, 1706157, 1-7.

Hirsch, Arthur; Michaud, Hadrien 0.; Gerratt, Aaron P.; De Mulatier, Severine; Lacour, Stephanie P.; Intrinsically Stretchable Biphasic (Solid-Liquid) Thin Metal Films. Adv. Mater. 2016, 28, 4507-4512.

Trevor R. Lear, Seok-Hee Hyun, John William Boley, Edward L. White, David H. Thompson, Rebecca K. Kramera, Liquid metal particle popping: Macroscale to nanoscale. Extreme Mechanics Letters 2017, 13, 126-134.

Boley, John W.; White, Edward L.; Kramer, Rebecca K.; Mechanically Sintered Gallium-Indium Nanoparticles Adv. Mater. 2015, 27, 2355-2360.

Yamaguchi, Akihisa; Mashima, Yu; Iyoda, Tomokazu; Reversible Size Control of Liquid-Metal Nanoparticles under Ultrasonication. Angew. Chem. Int. Ed. 2015, 54, 12809-12813.

Cooper, Matthew A.; Ostanin, Victor P.; Klenerman, David; Slepstov, Alexander; Karaimanska, Rossitza; Dultsev, Fedor N.; Stirrups, Kathleen; Kelling, Sven; Iminson, Tony; Abell, Chris; A sensitive and economical method to directly detect particles. Sensors, 2002 IEEE; DOI: 10.1109/ICSENS.2002.1037256,1042-1045.

Tang, Shi-Yang; Qiao, Ruirui; Yan, Sheng; Yuan, Dan; Zhao, Qianbin; Yun, Guolin; Davis, Thomas P.; Li, Weihua; Microfluidic Mass Production of Stabilized and Stealthy Liquid Metal Nanoparticles. Small 2018, 14, 1800118, 1-8.

Tevis, Ian D.; Newcomb, Lucas B.; Thuo, Martin; Synthesis of Liquid Core-Shell Particles and Solid Patchy Multicomponent Particles by Shearing Liquids Into Complex Particles (SLICE). Langmuir 2014, 30, 14308-14313.

Pan, Chengfeng; Kumar, Kitty; Li, Jianzhao; Markvicka, Eric J.; Herman, Peter R.; Majidi, Carmel; Visually Imperceptible Liquid-Metal Circuits for Transparent, Stretchable Electronics with Direct Laser Writing; Adv. Mater. 2018, 1706937, 1-9.

Çinar, Simge; Tevis, Ian D.; Chen, Jiahao; Thuo, Martin; Mechanical Fracturing of Core-Shell Undercooled Metal Particles for Heat-Free Soldering; Scientific Reports 2016,| 6:21864 | DOI: 10.1038/srep21864, 1-10.

Kubo, Masahiro; Li, Xiaofeng; Kim, Choongik; Hashimoto, Michinao; Wiley, Benjamin J.; Ham, Donhee; Whitesides; George M.; Stretchable Microfluidic Radiofrequency Antennas; Adv. Mater. 2010, 22, 2749-2752.

Hayes, Gerard J.; So, Ju-Hee; Qusba, Amit; Dickey, Michael D.; Lazzi, Gianluca; Flexible Liquid Metal Alloy (EGaIn) Microstrip Patch Antenna. IEEE Transactions on Antennas and Propagation. 2012, vol. 60, No. 5, 2151-2156.

So, Ju-Hee; Thelen, Jacob; Qusba, Amit; Hayes, Gerard J.; Lazzi, Gianluca; Dickey, Michael D.; Reversibly Deformable and Mechanically Tunable Fluidic Antennas. Adv. Funct. Mater. 2009, 19, 3632-3637.

Larmagnac, Alexandre; Eggenberger, Samuel; Janossy, Hanna; Voros, Janos; Stretchable electronics based on Ag-PDMS composites. Scientific Reports, 2014, 4:7254, 1-7.

Fassler, Andrew; Majidi, Carmel; Liquid-Phase Metal Inclusions for a Conductive Polymer Composite. Adv. Mater. 2015, 27, 1928-1932.

Khan, M. Rashed; Hayes, Gerard J.; Zhang, Silu; Dickey, Michael D.; Lazzi, Gianluca; A pressure responsive fluidic microstrip open stub resonator using a liquid metal alloy. IEEE Microwave Wireless Components Letters, 2012, vol. 22, No. 11, pp. 577-579.

Kubo, Masahiro; Li, Xiaofeng; Kim, Choongik; Hashimoto, Michinao; Wiley, Benjamin J.; Ham, Donhee; Whitesides, George M.; Stretchable microfluidic electric circuit applied for radio frequency antenna. Proc. IEEE APS-URSI, 2011, pp. 1582-1587.

Mazlouman, Shahrzad J.; Jiang, Xing J.; Mahanfar, Alireza N.; Menon, Carlo; Vaughan, Rodney G.; A reconfigurable patch antenna using liquid metal embedded in a silicone substrate. IEEE Trans. Antenna Propagat. Lett., 2011, vol. 59, pp. 4406-4412.

Diedhiou, Daouda L.; De Sagazan, Olivier; Sauleau, Ronan; Boriskin, Artem V.; Contactless microstrip transition for flexible microfluidic circuits and antennas. IEEE Antennas Wireless Propagat. Lett., 2015, vol. 14, pp. 1502-1505.

Agar, J.; Durden, J.; Staiculescu, D.; Zhang, R.; Gebara, E. ; Wong, C.P.; Electrically conductive silicone nano-composites for stretchable RF devices. IEEE MTT-S IMS 2011.

Thrasher, C.; Zachary Farrell, Z.; Morris, N.; Willey, C.; Tabor, C.; Supporting Materials, Adv. Mater., 2019 DOI: 10.1002/adma. 201903864, 1-7.

(56) References Cited

OTHER PUBLICATIONS

Thrasher, C.; Zachary Farrell, Z.; Morris, N.; Willey, C.; Tabor, C.; Mechanoresponsive Polymerized Liquid Metal Networks, Adv. Mater. 2019, 1903864, 1-8.

Tabor, C.; Polymerized Liquid Metal Networks for Stretchable Electronics ACS Colloids and Interfaces Conference, Jun. 18, 2019.

Tabor, C.; Adaptive 3D-Printed Liquid Metal Electronics TMS 2019, Mar. 13, 2019.

Tabor, C.; Responsive 3D-Printed Liquid Metal Electronics, MITRE Workshop May 6, 2019.

Tabor, C.; Gordon Research Conference Poster, Jan. 30, 2019.

Tabor, C.; Responsive Liquid Metals for Reconfigurable, Ultra-Stretchable, and Self-Healing Electronics, IEEE Flex Electronics Meeting, Aug. 13, 2019.

Tabor, C.; Polymerized Liquid Metal Networks for Stretchable Electronics, Flex Tech 2019, Feb. 21, 2019.

Zhu, P.; Gao, S.; Lin, H.; Lu, X.; Yang, B.; Zhang, L.; Chen, Y.; Shi, J.; Inorganic Nanoshell-Stabilized Liquid Metal for Targeted Photonanomedicine in NIR-II Biowindow. Nano Lett. 2019, 19, 2128-2137.

Ren, L.; Sun, S.; Casillas-Garcia, G.; Nancarrow, M.; Peleckis, G.; Turdy, M.; Du, K; Xu, X.; Li, W.; Jiang, L.; Dou, S. X.; Du, Y.; A Liquid-Metal-Based Magnetoactive Slurry for Stimuli-Responsive Mechanically Adaptive Electrodes. Advanced Materials. Adv. Mater. 2018, 30, 1802595.

Park, S.; Thangavel, G.; Parida, K.; Li, S.; Lee, P. S.; A Stretchable and Self-Healing Energy Storage Device Based on Mechanically and Electrically Restorative Liquid-Metal Particles and Carboxylated Polyurethane Composites. Adv. Mater. 2019, 31, 1805536.

Morris, N. J.; Farrell, Z. E.; Tabor, C. E.; Chemically modifying the mechanical properties of core-shell liquid metal nanoparticles. Nanoscale, 2019, 11, 17308-17318.

Liang, S.; Li, Y.; Chen, Y.; Yang, J.; Zhu, T.; Zhu, D.; He, C.; Liu, Y.; Handschuh-Wang, S.; Zhou, X.; Liquid metal sponges for mechanically durable, all-soft, electrical conductors. J. Mater. Chem. C, 2017, 5, 1586-1590.

Song, H.; Kim, T.; Kang, S.; Jin, H.; Lee, K.; Yoon, H. J.; Ga-Based Liquid Metal Micro/Nanoparticles: Recent Advances and Applications. Small 2019, 1903391.

Saborio, M. G.; Cai, S.; Tang, J.; Ghasemian, M. B.; Mayyas, M.; Han, J.; Michael J. Christoe, M. J.; Peng, S.; Koshy, P.; Esrafilzadeh, D.; Jalili, R.; Wang, C. H.; Kalantar-Zadeh, K.; Liquid Metal Droplet and Graphene Co-Fillers for Electrically Conductive Flexible Composites. Small 2019, 1903753.

Tutika, R.; Kmiec, S.; Haqu, A. B. M. T.; Martin, S. W.; Bartlett, M. D.; Liquid Metal-Elastomer Soft Composites with Independently Controllable and Highly Tunable Droplet Size and Volume Loading. ACS Appl. Mater. Interfaces 2019, 11, 17873-17883.

Li, X.; Li, M.; Xu, J.; You, J.; Yang, Z.; Li, C.; Evaporation-induced sintering of liquid metal droplets with biological nanofibrils for flexible conductivity and responsive actuation. Nature Communications, 2019,10:3514.

Guo, R.; Wang, H.; Sun, X.; Yao, S.; Chang, H.; Wang, H.; Liu, J.; Zhang, Y.; Semiliquid Metal Enabled Highly Conductive Wearable Electronics for Smart Fabrics. ACS Appl. Mater. Interfaces 2019, 11, 30019-30027.

Park, J. E.; Kang, H. S.; Baek, J.; Park, T.H.; Oh, S.; Lee, H.; Koo, M.; Park, C.; Rewritable, Printable Conducting Liquid Metal Hydrogel. ACS Nano 2019, 13, 9122-9130.

\* cited by examiner

ARTICLES COMPRISING A RESISTOR COMPRISING CORE SHELL LIQUID METAL ENCAPSULATES AND METHOD OF DETECTING AN IMPACT

CROSS-REFERENCE TO RELATED APPLICATION

The present application claims priority to U.S. Provisional Application Ser. No. 62/754,631 filed Nov. 2, 2018, the contents of which is hereby incorporated by reference in their entry.

RIGHTS OF THE GOVERNMENT

The invention described herein may be manufactured and used by or for the Government of the United States for all governmental purposes without the payment of any royalty.

FIELD OF THE INVENTION

The present invention relates to articles comprising a resistor comprising core shell liquid metal encapsulates and methods of detecting an impact on an article using a resistor comprising core shell liquid metal encapsulates.

BACKGROUND OF THE INVENTION

There are a number of methods of detecting an impact on an object such as a satellite, munition or shipping container including single-use colorimetric impact stickers or more complex sensor systems such as piezoelectric accelerometers or spring-mass based systems. All of such methods have one or more of the following drawbacks: excessive cost, complexity, size, weight, and/or power consumption. In addition, many of such methods can only tell if an impact has occurred. Thus, the time of impact is an unknown variable. Thus, what is needed is a method of detecting and impact that minimizes or even obviates the aforementioned drawbacks and articles that are designed to take advantage of such method.

Applicants recognized that phenomena such as g forces and kinetic impacts generate, among other things, acceleration gradients that generate forces that are similar to a directly applied compressive force. Based on such recognition, Applicants' discovered that core shell liquid metal encapsulates could enable simple but robust impact and g force sensors as such encapsulates comprise a highly electrically insulating metal oxide shell that prevents such encapsulates from coalescing. Yet when such shell is ruptured, the highly conductive bulk liquid metal is released. Such liquid metal changes the electrical properties of a sensor comprising core shell liquid metal encapsulates which in turn is evidence of the aforementioned impact or g force. Because core shell liquid metal encapsulates are employed, a functional sensing unit can range from 1-100 microns in size. Thus, such unit can fit in places where other impact sensors are impractical. For example, such sensing units can be placed on the back of a heat shield panel for a re-entry vehicle, providing real-time information of impacts for each individual panel. Such units can also be used for micrometeorite detection in satellites as the trace widths are so small that a grid sensor could detect where on a microchip a micrometeorite has struck. In addition, when an impact sensitive RFID antenna comprises core shell liquid metal encapsulates the RF signature changes after an impact because part of the antenna is made of a liquid metal particle trace. Thus, such antenna can be used to monitor impact sensitive components, such as the mechanical devices in explosives and munitions. When such antenna is placed directly onto a sensitive component so it experiences the same impact history as the sensitive component, the impact on the sensitive component is detected. Thus, the exact time an impact can be determined with a sensor that has a very small footprint and automated damage inspection may be enabled. Furthermore, responsive g force switches are disclosed. Such articles are further detailed and additional articles comprising a resistor comprising core shell liquid metal encapsulates and methods of detecting an impact or g force on an article using a resistor comprising core shell liquid metal encapsulates are disclosed herein

SUMMARY OF THE INVENTION

Articles comprising a resistor comprising core shell liquid metal encapsulates and methods of detecting an impact on an article using a resistor comprising core shell liquid metal encapsulates are disclosed. Such core shell liquid metal encapsulates enable simple but robust impact sensors as such encapsulates comprise a highly electrically resistant metal oxide shell that prevents such encapsulates from coalescing. Yet when such shell is ruptured, the highly conductive bulk liquid metal is released. Such liquid metal changes electrical properties of a sensor comprising core shell liquid metal encapsulates which in turn is evidence of the aforementioned impact.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Figure 1A:
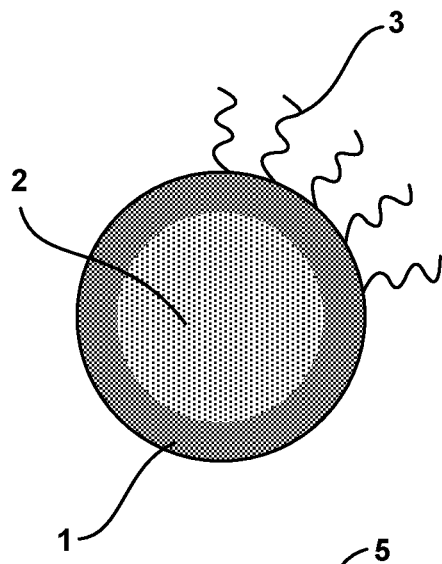
FIG. 1A is a cross-sectional view of a core shell liquid metal encapsulate comprising core 2 comprising eutectic gallium-indium alloy, multi-functional ligands 3 with head group that are covalently bound to gallium oxide comprising metal oxide shell 1.
Figure 1B:
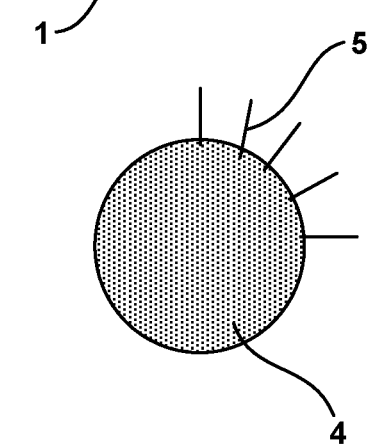
FIG. 1B is a cross-sectional view of a core shell liquid metal encapsulate, prior to shell formation, comprising multi-functional ligands 5 with head group that are coordinatively bound to the liquid metal core 4 that comprises eutectic gallium-indium alloy.
Figure 1C:
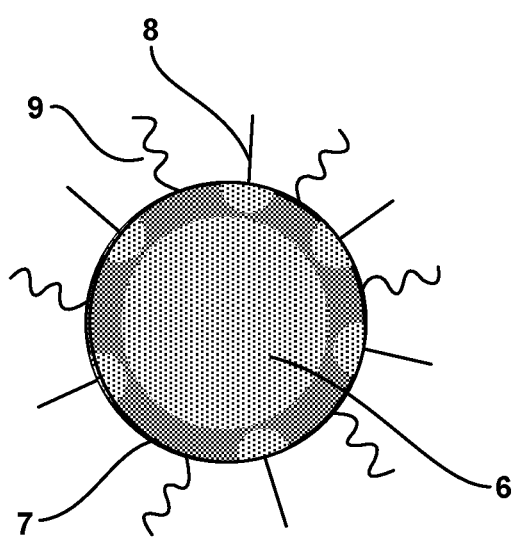
FIG. 1C is a cross-sectional view of a core shell liquid metal encapsulate comprising multi-functional ligands 9 that are covalently bound to gallium oxide comprising metal oxide shell 7 of such encapsulate and multi-functional ligands 8 that are coordinatively bound to the liquid metal core of such encapsulate via gallium eutectic gallium-indium alloy pocket in shell 7.

Unless specifically stated otherwise, as used herein, the terms "a", "an" and "the" mean "at least one".

As used herein, the terms "include", "includes" and "including" are meant to be non-limiting.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

As used in this specification, the term "EGaIn" is used to denote an alloy composed of 85.8% Ga, 14.2% In on an atomic basis.

All references in this specification to ImageJ software are to ImageJ software Version 1.51n.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Articles Comprising a Resistor Comprising Core Shell Liquid Metal Encapsulates

An article is disclosed, said article comprising a resistor, said resistor comprising a plurality of encapsulates that comprise a liquid metal core, and a metal oxide shell that encapsulates said core, said encapsulates comprising one or more ligands covalently or coordinatively bound to said shell's external surface, said ligands comprising a head group that comprises a material selected from the group consisting of thiols, amines, phosphonic acids, alkoxysilanes, halosilanes, carboxylic acids, nitriles, and mixtures thereof; more preferably said one or more ligands comprise a head group that comprises a material selected from the group consisting of thiols, phosphonic acids, trialkoxysilanes, trichlorosilanes, and mixtures thereof; more preferably said one or more ligands comprise a head group that comprises a material selected from the group consisting of thiols, trialkoxysilanes or phosphonic acids, and one or more additional moieties selected from the group consisting of a hydrosilane, a cyclic ester, an azide, an alcohol, an alkyne, an alkene, an isocyanate, a conjugated diene, an imine, a boronate ester, a conjugated ring, a carboxylic acid, an amine, a thiol, a phosphonic acid, an alkoxysilane, a halosilane, a nitrile and mixtures thereof; preferably said one or more additional moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof most preferably said one or more ligands are selected from the group consisting of 11-phosphonoundecyl acrylate, 3-(trimethoxysilyl)propyl acrylate, 3-(trimethoxysilyl)propyl methacrylate, (3-glycidyloxypropyl) triethoxysilane, 3-(triethoxysilyl)propyl isocyanate, 12-azidododecylphosphonic acid, trimethoxy[2-(7-oxabicyclo[4.1.0]hept-3-yl)ethyl]silane, 3-cyclopentadienylpropyltriethoxysilane, [(5-bicyclo[2.2.1]hept-2-enyl)ethyl]triethoxysilane, 11-phosphonoundecanoic acid, and mixtures thereof.

An article according to Paragraph 0019 is disclosed wherein said resistor is selected from the group consisting of:
a) a resistor comprising a composite comprising a matrix material and said plurality of encapsulates that comprise a liquid metal core, and a metal oxide shell that encapsulates said core, said encapsulates being embedded in said matrix material;
b) a resistor wherein one or more of said encapsulates are covalently bound to a matrix material through one or more ligands which are covalently or coordinatively bound to said encapsulates' shell's external surface; or
c) a resistor wherein one or more of said encapsulates are chemically bound via a linkage comprising the ligands of said encapsulates to the external shell of an encapsulate other than the external shell of the encapsulate to which said ligand was originally covalently bound.

An article according to any of Paragraphs 0019 through 0020 is disclosed, wherein said article is an RFID device, a time recording device, a Bluetooth communication device, a location mapped device, or a fuze.

An article according to any of Paragraphs 0019 through 0020 is disclosed, wherein said article comprises a power source, preferably said power source comprises a battery, an antenna, a microcontroller, a CPU, an adhesive, and/or a rigid connecting surface, preferably said rigid connecting surface is conformally applied before rigidifying, more preferably said rigid connecting surface comprises an epoxy, urethane, or acrylate based adhesive that is conformally applied before rigidifying, a container, or an encapsulate, preferably said encapsulate is a polymer.

An article is disclosed, said article comprising a resistor, a power source, preferably said power source is a battery, a communication module, preferably said communication module comprises a microcontroller and/or an antenna, and a rigid surface; wherein said resistor comprises a plurality of encapsulates that comprise a liquid metal core, and a metal oxide shell that encapsulates said core, and wherein at least one of the elements in the group comprising said power source and said communication module in addition to said resistor are affixed to said rigid surface, preferably said power source and said resistor are affixed to said rigid surface, more preferably said power source, said resistor, and said communication module are affixed to said rigid surface.

An article according to Paragraph 0023 is disclosed, said article being an RFID device, a time recording device, a Bluetooth communication device, a location mapped device, or a fuze.

An article according to any of Paragraphs 0023 through 0024 is disclosed, wherein said rigid surface is conformally applied to another surface before rigidifying, more preferably said rigid surface comprises an epoxy, urethane, or acrylate based adhesive that is conformally applied to another surface before rigidifying.

An article according to any of Paragraphs 0023 through 0025 is disclosed, wherein said article comprises a CPU, an adhesive, a container, or an encapsulate, preferably said encapsulate is a polymer.

Methods of Detecting an Impact on an Article Using a Resistor Comprising Core Shell Liquid Metal Encapsulates A method of detecting an impact on a surface is disclosed, said method comprising:

a) measuring a change in a resistor's resistance or a change in a system triggered by said change in said resistor's resistance, said resistor comprising a plurality of encapsulates that comprise a liquid metal core, and a metal oxide shell that encapsulates said core, said change in said resistor's resistance being caused at least in part by a change in the momentum of at least a portion said plurality of encapsulates as a result of an impact, preferably said change in the momentum of at least a portion said plurality of encapsulates is caused at least in part by an acoustic wave arising as a result of said impact; and b) using said change in said resistor's resistance and/or change in said system triggered by said change in said resistor's resistance as confirmation of said impact on said surface.

A method of detecting an impact according to Paragraph 0027 is disclosed, wherein said change in the resistance of said resistor is from about 0.00001 to about 15 orders of magnitude, preferably said change in the resistance of said resistor is from about 1 to about 15 orders of magnitude, more preferably said change in the resistance of said resistor is from about 5 to about 12 orders of magnitude, and most preferably said change in the resistance of said resistor is from about 7 to about 10 orders of magnitude.

A method of detecting an impact according to any of Paragraphs 0027 through 0028 is disclosed, wherein said encapsulates are from about 5 nanometers to about 5 millimeters in diameter, preferably said encapsulates are from about 50 nanometers from about 50 micrometers in diameter, more preferably said encapsulates are from about 100 nanometers to about 5 micrometers in diameter.

A method of detecting an impact according to Paragraphs 0027 or 0029 is disclosed, wherein said encapsulates have a shell thickness from about 0.5 nanometers to about 20 nanometers, preferably said encapsulates have a shell thickness from about 0.5 nanometers to about 5 nanometers.

A method of detecting an impact according to any of Paragraphs 0027 through 0030 is disclosed, wherein said liquid metal core comprises a liquid metal selected from the group consisting of Hg, Pb, Sn, Sb, Cd, Bi, Ga, In, Al, Zn, Ag, Au, Tl and mixtures thereof, preferably said liquid metal is selected from the group consisting of Ga, In, Sn, Bi, Pb, Cd, Sb and mixtures thereof, more preferably said liquid metal is selected from the group consisting of Ga, In, Sn, Bi, Sb and mixtures thereof, most preferably said liquid is metal selected from the group consisting of Ga, In and mixtures thereof.

A method of detecting an impact according to any of Paragraphs 0027 through 0031 is disclosed, wherein said liquid metal core comprises a liquid metal alloy selected from the group consisting of Ga/In, Ga/In/Sn, Ga/In/Sn/Sb, In/Sn/Bi, Bi/Pb/Sn, Bi/Pb/Sn/Cd, Bi/Pb/Sn/Cd/In and mixtures thereof, preferably said liquid metal is selected from the group consisting of Ga/In, Ga/In/Sn, Ga/In/Sn/Sb, In/Sn/Bi and mixtures thereof, most preferably said liquid is metal selected from the group consisting of 85.8 atom % Ga/14.2 atom % In, 78.3 atom % Ga/14.9 atom % In/6.8 atom % Sn and mixtures thereof.

A method of detecting an impact according to any of Paragraphs 0027 through 0032 is disclosed, wherein said shell comprises a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb and mixtures thereof; preferably said metal oxide comprises a cation derived from a metal selected from the group consisting of Ga, Al, Zn, Sc, Ti, Cr, Zr, Nb, Gd, Nd, Sm and mixtures thereof, more preferably said metal oxide comprises a cation derived from a metal selected from the group consisting of Ga, Al, Zn, Gd, Nd and mixtures thereof.

A method of detecting an impact according to any of Paragraphs 0027 through 0033 is disclosed, wherein said encapsulates comprise one or more ligands covalently or coordinatively bound to said shell's external surface, preferably said one or more ligands comprise a head group that comprises a material selected from the group consisting of thiols, amines, phosphonic acids, alkoxysilanes, halosilanes, carboxylic acids, nitriles, and mixtures thereof, more preferably said one or more ligands comprise a head group that comprises a material selected from the group consisting of thiols, phosphonic acids, trialkoxysilanes, trichlorosilanes, and mixtures thereof, more preferably said one or more ligands comprise a head group that comprises a material selected from the group consisting of thiols, trialkoxysilanes or phosphonic acids, and one or more additional moieties selected from the group consisting of a hydrosilane, a cyclic ester, an azide, an alcohol, an alkyne, an alkene, an isocyanate, a conjugated diene, an imine, a boronate ester, a conjugated ring, a carboxylic acid, an amine, a thiol, a phosphonic acid, an alkoxysilane, a halosilane, a nitrile and mixtures thereof; preferably said one or more additional moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof; most preferably said one or more ligands are selected from the group consisting of 11-phosphonoundecyl acrylate, 3-(trimethoxysilyl)propyl acrylate, 3-(trimethoxysilyl)propylmethacrylate, (3-glycidyloxypropyl) triethoxysilane, 3-(triethoxysilyl)propyl isocyanate, 12-azidododecylphosphonic acid, trimethoxy[2-(7-oxabicyclo[4.1.0]hept-3-yl)ethyl]silane, 3-cyclopentadienylpropyltriethoxysilane, [(5-bicyclo[2.2.1]hept-2-enyl)ethyl]triethoxysilane, 11-phosphonoundecanoic acid, and mixtures thereof.

A method of detecting an impact according to any of Paragraphs 0027 through 0034 is disclosed, wherein said resistor is a component of said system.

A method of detecting an impact according to any of Paragraphs 0027 through 0035 is disclosed, wherein said resistor is selected from the group consisting of:

a) a resistor comprising a composite comprising a matrix material and said plurality of encapsulates that comprise a liquid metal core, and a metal oxide shell that encapsulates said core, said encapsulates being embedded in said matrix material;

b) a resistor that is encapsulated with a protective material;

c) a resistor wherein one or more of said encapsulates are covalently bound to a matrix material through one or more ligands which are covalently or coordinatively bound to said encapsulates' shell's external surface;

d) a resistor wherein one or more of said encapsulates are chemically bound via a linkage comprising the ligands of said encapsulates to the external shell of an encapsulate other than the external shell of the encapsulate to which said ligand was originally covalently bound.

A method of detecting an impact according to any of Paragraphs 0027 through 0036 is disclosed, wherein said change in said system triggered by said change in said resistor's resistance is a change in voltage, resistance, current, impedance, and/or capacitance.

A method of detecting an impact according to any of Paragraphs 0027 through 0037 is disclosed, wherein said system comprises an antenna, a transmission line, a wave guide, an optical coating and/or a frequency selective surface.

A method of detecting an impact according to any of Paragraphs 0027 through 0038 is disclosed, wherein said resistor releases a charge in response to said impact, preferably said resistor comprises two metals having different redox potentials. Said difference in redox potentials may be the source of the energy for said charge.

Process of Making Encapsulates Comprising a Liquid Metal Core and Core Shell Liquid Metal Encapsulate Networks In addition to the teachings of the examples of the present specification, Applicants disclose a process of producing an encapsulate comprising a liquid metal core and a metal oxide shell that encapsulates said liquid metal core, said process comprising:
  a) contacting a liquid metal selected from the group consisting of Hg, Pb, Sn, Sb, Cd, Bi, Ga, In, Al, Zn, Ag, Au, Tl and mixtures thereof; preferably said liquid metal is selected from the group consisting of Ga, In, Sn, Bi, Pb, Cd, Sb and mixtures thereof; more preferably said liquid metal is selected from the group consisting of Ga, In, Sn, Bi, Sb and mixtures thereof; most preferably said liquid is metal selected from the group consisting of Ga, In and mixtures thereof; with one or more multi-functional ligands comprising a material selected from the group consisting of thiols, amines, and mixtures thereof; preferably said one or more multi-functional ligands comprise a material selected from the group consisting of thiols; more preferably said one or more multi-functional ligands comprise a material selected from the group consisting of thiols and one or more moieties selected from the group consisting of a hydrosilane, a cyclic ester, an azide, an alcohol, an alkyne, an alkene, an isocyanate, a conjugated diene, an imine, a boronate ester, a conjugated ring and mixtures thereof; preferably said one or more moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof; and/or
  b) contacting at least a portion of said metal oxide shell with one or more multi-functional ligands comprising a material selected from the group consisting of phosphonic acids, alkoxysilanes, halosilanes, carboxylic acids and mixtures thereof; preferably said one or more multi-functional ligands comprise a material selected from the group consisting of phosphonic acids, trialkoxysilanes, trichlorosilanes, and mixtures thereof; more preferably said one or more multi-functional ligands comprise a material selected from the group consisting of trialkoxysilanes or phosphonic acids, and one or more moieties selected from the group consisting of a hydrosilane, a cyclic ester, an azide, an alcohol, an alkyne, an alkene, an isocyanate, a conjugated diene, an imine, a boronate ester, a conjugated ring and mixtures thereof; preferably said one or more moieties is selected from the group consisting of an unsubstituted anthracene, a substituted anthracene, an acrylate, a methacrylate, an epoxide, a ring-strained alkene, an unsubstituted alkene, a terminal alkyne, an acrylamide, a methacrylamide, a norbornene and mixtures thereof; most preferably said one or more ligands are selected from the group consisting of 11-phosphonoundecyl acrylate, 3-(trimethoxysilyl)propyl acrylate, 3-(trimethoxysilyl)propyl methacrylate, (3-glycidyloxypropyl) triethoxysilane, 3-(triethoxysilyl)propyl isocyanate, 12-azidododecylphosphonic acid, trimethoxy[2-(7-oxabicyclo[4.1.0]hept-3-yl)ethyl]silane, 3-cyclopentadienylpropyltriethoxysilane, [(5-bicyclo[2.2.1]hept-2-enyl)ethyl]triethoxysilane and mixtures thereof;
  c) optionally agitate and/or heat the combination formed in a) and/or b), preferably said agitation is sufficient to prevent sedimentation of said encapsulates and the temperature of said combination formed in a) and/or b) is maintained at a temperature of from about 45° C. to about 60° C. for a time of about two to about four hours;
  d) optionally, removing unbound ligands by dialysis with a solvent and/or by several iterations of centrifugation and washing;
  e) optionally, suspending the core shell liquid metal encapsulates in fresh solvent.

Applicants disclose a process according to Paragraph 0040 wherein one, two or three of the following steps are preformed:
  a) the combination formed in a) and/or b) of Paragraph 0040 is agitated and/or heated, preferably said agitation is sufficient to prevent sedimentation of said encapsulates and the temperature of said combination formed in a) and/or b) of Paragraph 0040 is maintained at a temperature of from about 45° C. to about 60° C. for a time of about two to about four hours;
  b) unbound ligands are removed by dialysis with a solvent and/or by several iterations of centrifugation and washing;
  c) the core shell liquid metal encapsulates are suspended in fresh solvent Applicants disclose a process of producing a core shell liquid metal encapsulate network from a plurality of core shell liquid metal encapsulates comprising multi-functional ligands, said process comprising stimulating said multi-functional ligands by imparting energy to said ligands and/or combining said multi-functional ligands with one or more initiators; preferably said energy is imparted by electromagnetic radiation, heat, or mechanical stimulus and preferably said one or more initiators is selected from the group consisting of photoradical initiators, thermoradical initiators, mechanoradical generators, photoacid generators, thermal acid generators, mechano-acid generators, poly-azido molecules, poly-alkyne molecules, poly-thiol molecules, poly-alkene molecules, polyols, poly-isocyanates, copper compounds, ruthenium compounds, silver compounds, and reducing organic acids and more preferably, said energy is imparted by electromagnetic radiation or heat and preferably said one or more initiators is selected from the group consisting of photoradical initiators, photoacid generators, thermal acid generators, poly-alkyne molecules, poly-alkene molecules, polyols, copper compounds, ruthenium compounds, and reducing organic acids; most preferably, said energy is imparted by electromagnetic radiation and preferably said one or more initiators is selected from the group consisting of photoradical initiators, photoacid generators, poly-alkyne molecules, polyols, copper compounds, and ascorbic acid.

Applicants disclose a process according to Paragraph 0042 wherein said core shell liquid metal encapsulates comprising multi-functional ligands are suspended in a continuous liquid phase prior to being stimulated and optionally deposited on a substrate and optionally dried on said substrate.

Test Methods

Determination of Encapsulate Principal Dimension

Preparation of Sizing Encapsulates in the Size Range of 10 nanometers to 500 nanometers. Encapsulates are sized using high-resolution scanning transmission electron microscope (STEM) images taken with a high-angle annular dark-field detector on a transmission electron microscope operating at an accelerating voltage of 200,000 electron volts. Encapsulate particles are mounted for STEM measurements by first adding 50 microliters of a given encapsulate suspension having an encapsulate concentration between $1*10^{-5}$ and $1*10^{-4}$ millimolar to 2 milliliters of dichloromethane followed by dropping this diluted suspension onto a 400-mesh copper, carbon-film coated transmission electron microscopy grid held in self-closing, anti-capillary tweezers until a single drop falls from the grid. Following deposition, a folded piece of filter paper is used to wick excess solvent from the grid underside.

Preparation of Sizing Encapsulates in the Size Range of 501 nanometers to 5,000,000 nanometers (5 millimeters). The encapsulates are prepared for measurement by first casting films on copper tape and coating the encapsulates in 10 nm of iridium. Encapsulates are characterized using scanning electron microscopy (SEM) at an accelerating voltage of 1000 volts and with an aperture of 20 micrometers.

ImageJ software (freely available from the National Institute of Health) is used to open images corresponding to each sample and to manually draw lines bisecting encapsulates along their longest dimension, followed by recording the length of each line drawn. This process is repeated for at least 300 encapsulates in each sample. Following measurement, the average diameter and surface-area weighted average diameter are calculated from the tabulated data.

Shell Thickness—Scanning Transmission Electron Microscopy (STEM)

STEM images of encapsulate particles are processed using the "Find Edges" routine built into the software package ImageJ which uses a Sobel image filter to highlight spatial changes in image contrast. As STEM images provide contrast based on the atomic number of the elements imaged, oxide shells typically have a difference in signal from the encapsulate core and any adventitious carbon overlayer. The "Find Edges" function reveals two lines surrounding the encapsulate; one line corresponds to the shell inner edge and one line corresponds to the shell outer edge. An intensity profile is generated within ImageJ by drawing a line which perpendicularly bisects the shell inner and outer edges followed by selection of the "Plot Profile" function. A line is then drawn on the resultant profile between the intensity maxima and a measurement taken of this distance. 50 of these measurements are taken and averaged to calculate the average encapsulate shell thickness.

Shell Thickness—X-Ray Photoelectron Spectroscopy (XPS)

XPS measurements of encapsulate oxide shell thicknesses are produced as follows. Two films for XPS are produced by spin-coating a first encapsulate sample dispersed in absolute ethanol at 2000 RPM onto substrates consisting of single-sided copper adhesive tape affixed to a 1 centimeter×1 centimeter piece of glass and a second encapsulate sample dispersed in anhydrous chlorobenzene at 2000 RPM onto substrates consisting of single-sided copper adhesive tape affixed to a 1 centimeter×1 centimeter piece of glass. The encapsulate suspension is deposited dropwise onto the spinning substrate until the layer has thickened such that the copper foil is no longer visible through the encapsulate film. Encapsulate suspensions are vortex mixed for 30 seconds immediately prior to deposition to ensure homogeneity. Optical profilometry is used to determine the root mean square (RMS) roughness for each film. The film having the lower root mean square roughness is introduced into the XPS within 30 minutes to preclude significant oxidation in air, with XPS measurements commencing within 90 minutes.

All XPS spectra are collected using a monochromated Al source. First, ideal measurement regions are identified for each core and shell forming element present. These regions are selected to achieve as low of a binding energy as possible (to permit deep photoelectron escape) while still remaining deconvolutable from other elemental regions present. If it is necessary to perform deconvolution of elemental regions which overlap with other elemental regions, an independent, non-convoluted region is be chosen for the second element and used to constrain the peak-fit of the first element during software peak-fitting. High-resolution XPS spectra are then collected from each of these regions. In addition to collection of regions corresponding to metallic core/shell constituting elements present, a survey spectrum, the O1s region, and the C1s region are also collected.

To calculate the absolute thickness of the metal oxide shell surrounding the liquid metal core of the encapsulates, the following approach is used. First, the particle sizes are determined as previously described, and are reweighted to provide a surface-area weighted average which is used in these calculations. The identity of the core material is assumed based on redox and kinetic considerations, which may be bolstered by preliminary XPS analysis to determine the principal core and shell-forming elements present. The metal oxide shell is assumed to be stoichiometric for whatever oxide-forming element is present and the organic shell overlayer is assumed to have an atomic number of Z=4. The core is assumed to be constituted of the bulk alloy used to form the encapsulate. If spin-orbit components for a given elemental transition are convoluted, both are fitted by constraining the more convoluted peak area to the less convoluted peak area using spin-orbit splitting rules. If peaks due to spin-orbit splitting are not convoluted for a given elemental transition, only the larger peak is fitted. If multiple peaks arising from the same element are present in one transition (due to chemical state differences), all peaks are constrained to have identical full-width, half-maximum values. Values for binding energy shift may be taken from the NIST XPS Database to assist in deconvolution of multiple chemical states present in a given elemental transition, if necessary. If multiple values for the binding energy shift for a given chemical state of an element are present in the NIST XPS Database, the median value is used as the value for the binding energy shift. If no value is present in the NIST XPS Database for a given chemical state in a specific, desirable elemental transition, other literature values may be sought. Finally, appropriate lineshapes and background fits should be used, based on the manufacturer's specifications for the instrument.

Following tabulation of raw peak areas, these raw data are corrected based on the relative sensitivity factors for each elemental transition collected, based on published values from the manufacturer of the x-ray photoelectron spectrometer. Next, one of these corrected signals is selected which originates only from the core, one is selected which originates only from the oxide shell, and the C1s signal is assumed to originate only from the ligands and adventitious carbon overlayer. To prepare for shell thickness calculation, the following quantities are calculated:

$$L_{1,1} = 0.316 a_1^{3/2} \left\{ \frac{E_1}{Z_1^{0.45}[\ln(E_1/27)+3]} + 4 \right\}$$

$$B_{2,1} = (E_2/E_1)^{0.872}$$

$$B_{2,0} = (E_2/E_0)^{0.872}$$

$$C_{2,0} = (Z_2/Z_0)^{0.3}$$

$$C_{2,1} = (Z_2/Z_1)^{0.3}$$

$$L_{2,2} = L_{1,1}/(B_{2,1} C_{2,1})$$

where $L_{1,1}$ represents the photoelectron attenuation length of a photoelectron of material 1 (oxide shell material) passing through material 1, $a_1$ represents the atomic size of material 1 in nanometers which for purposes of this test methods is 0.25 nanometers in all metal oxide cases, $E_i$ represents the photoelectron energy in electron volts of the photoelectron from material i, and $Z_i$ represents the number averaged atomic number for material i, where i may be 0 for the liquid core, 1 for the oxide shell, and 2 for the carbonaceous overlayer. B and C are useful parameters for later calculations, and describe the relative opacity of each layer (core, oxide shell, carbonaceous overlayer) in the encapsulate. Next, the photoelectron attenuation length for photoelectrons originating from material 2 passing through material 2, $L_{2,2}$, is calculated. Finally, starting from the relative sensitivity factor corrected peak areas, the following quantities are calculated:

$$A_{1,0} = I_1/I_0$$

$$A_{2,1} = I_2/I_1$$

$$A_{2,0} = I_2/I_0$$

where $A_{i,j}$ represents the ratio of the photoelectron signal originating from material i to that originating from material j, and $I_i$ represents the relative sensitivity factor corrected photoelectron signal originating from material i.

To calculate the oxide shell thickness, $T_1$, and the carbonaceous overlayer thickness, $T_2$, the following iterative procedure is employed. $T_2$ is, for purposes of this test method, 0.1 nm. This value is converted into attenuation-length scaled units by dividing by $L_{2,2}$. Next, the value $A^*_{1,0}$ is calculated according to the equation:

$$A^*_{1,0} = A_{1,0}\{1 + n[\ln(T_2+1)]\} e^{[(B_{2,1}-B_{2,0})T_2]}$$

where $$n = \frac{1}{20}[(2B_{2,1} - B_{2,0})(4.5 + C_{2,1}) + 2(B_{2,0} - 1)C_{2,1} + 4.6]$$

followed by conversion of particle radius, R, from units of absolute length (nm or similar) to photoelectron attenuation length scale by division by $L_{1,1}$. Finally, a value for the oxide shell thickness, $T_1$, is calculated via the following set of equations:

$$T_{R \to \infty} = \frac{0.74 A^{3.6} \ln(A) B^{-0.9} + 4.2 AB^{-0.41}}{A^{3.6} + 8.9}$$

$$T_0 = R_{NP}\left[(ABC+1)^{\frac{1}{3}} - 1\right]$$

$$\alpha = \frac{1.8}{A^{0.1} B^{0.5} C^{0.4}}$$

$$\beta = \frac{0.13 \alpha^{2.5}}{R_{NP}^{1.5}}$$

$$T_{R-1} = \frac{T_{R \to \infty} R}{R_{NP} + \alpha}$$

$$T_1 = \frac{T_{R \to \infty} + \beta T_0}{1 + \beta}$$

where $$B = \frac{B_{2,0}}{B_{2,1}}$$

$$C = \frac{C_{2,0}}{C_{2,1}}$$

$$A = A^*_{1,0}$$

$$R_{NP} = R + T_1$$

The value for $T_1$ calculated in this manner is then converted from units of $L_{1,1}$ to units of $L_{2,2}$ by multiplying by $L_{2,2}/L_{1,1}$. Next, the following quantities are calculated:

$$A_{eff} = \frac{A_{2,1} A_{2,0}}{A_{2,1} + A_{2,0}}$$

$$B_{eff} = w B_{2,1} + (1-w) B_{2,0}$$

$$C_{eff} = w C_{2,1} + (1-w) C_{2,0}$$

where $$w = \frac{A_{1,0}}{A_{1,0} + 0.8 + 0.5 B_{1,0}^4}$$

Next, the value for particle radius, R, is converted into units of $L_{2,2}$ by dividing R by $L_{2,2}$. Finally, a new value for $T_2$ is calculated via the following equations:

$$T_{R \to \infty} = \frac{0.74 A^{3.6} \ln(A) B^{-0.9} + 4.2 AB^{-0.41}}{A^{3.6} + 8.9}$$

$$T_0 = R_{NP}\left[(ABC+1)^{\frac{1}{3}} - 1\right]$$

$$\alpha = \frac{1.8}{A^{0.1} B^{0.5} C^{0.4}}$$

$$\beta = \frac{0.13 \alpha^{2.5}}{R_{NP}^{1.5}}$$

$$T_{R-1} = \frac{T_{R \to \infty} R}{R_{NP} + \alpha}$$

$$T_2 = \frac{T_{R \to \infty} + \beta T_0}{1 + \beta}$$

where $$A = A_{eff}$$

$$B = B_{eff}$$

$$C = C_{eff}$$

$$R_{NP} = R + T_1$$

and $R_{NP}$, R, and $T_1$ are expressed in units of $L_{2,2}$.

To converge on consistent values for $T_1$, the oxide shell thickness, and $T_2$, the carbonaceous shell thickness, the above procedure for calculating $T_1$ and $T_2$ is iterated on until the values for $T_1$ and $T_2$ converge across two cycles wherein the deviation between the two cycles is less than 0.01%. These values are then taken as the actual absolute thicknesses of the oxide shell and carbonaceous overlayer.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1 An EGaIn Particle Resistor Based Impact Sensor Gallium and Indium were combined to produce a eutectic liquid alloy of GaIn (14.2 atom % In, 85.8 atom % Ga). A total of 200 mg of this EGaIn alloy was added to 10 mL of ethanol (200 proof, anhydrous USP) in a 20 mL glass vial. The mixture was sonicated in an ultrasonic bath at 45° C. for two hours to produce GaIn particles having a number average diameter of about 3 microns. The resulting colloidal solution was centrifuged at 2600 RCF for 3 minutes and the supernatant was removed and replaced. This process was repeated three times, after which the particles were suspended in 4 mL of ethanol. The resulting colloidal solution of particles was drop cast onto a rigid ceramic plate and the ethanol was allowed to evaporate away to form a trace with dimensions of about 3 mm×15 mm×0.1 mm.

Example 2 Method of Using an EGaIn Particle Resistor Based Impact Sensor An EGaIn particle resistor based impact sensor was prepared according to Example 1, after which a two-point probe current-voltage sweep between −1 and 1 volts was used to quantify an initial resistance of the resulting trace at about $1×10^{12}$ Ohms. The rigid ceramic plate was secured and subjected to an impact of about 100 N in an area adjacent to the trace of liquid metal encapsulates and about 5 cm away. A subsequent two-point probe current-voltage sweep between −1 and 1 volts was used to quantify a final resistance of about 10 Ohms.

Example 3 Method of Using an EGaIn Particle Resistor Based Impact Sensor for Satellites An EGaIn particle resistor based impact sensor is prepared according to Example 1 and the rigid ceramic plate is adhered to a flat and rigid section of a satellite. Copper wire is pressed into each end of the EGaIn particle resistor so as to rupture particles in contact with the wire and create an electrical connection. The EGaIn particle resistor and adjacent copper wire are then encapsulated with a rigid dielectric. The remaining open ends of copper wire are then connected to a power source with one open end and to a blue-tooth antenna with another. When an impact of sufficient magnitude strikes the rigid section of the satellite to which the rigid ceramic plate containing an EGaIn particle resistor is attached, the EGaIn particles that comprise the resistor will rupture and release liquid metal that will electrically connect the power source to the blue-tooth antenna. The powered antenna will then emit a signal.

Example 4 Method of Using an EGaIn Particle Resistor Based Impact Sensor for Body Armor An EGaIn particle resistor based impact sensor is prepared according to Example 1 except said colloidal solution of particles are drop cast directly onto the backside of a rigid section of body armor and the ethanol allowed to evaporate away to form a trace with dimensions of about 3 mm×5 mm×0.1 mm. Copper wire is pressed into each end of the EGaIn particle resistor so as to rupture particles in contact with the wire and create an electrical connection. The EGaIn particle resistor and adjacent copper wire are then encapsulated with a rigid dielectric. The remaining open ends of copper wire are then connected to a power source with one open end and to a blue-tooth antenna with another. When an impact of sufficient magnitude, such as a ballistic impact, strikes the body armor the EGaIn particles that comprise the resistor will rupture and release liquid metal that will electrically connect the power source to the blue-tooth antenna. The powered antenna will then emit a signal.

Example 5 Method of Using an EGaIn Particle Resistor Based Impact Sensor for Munitions An EGaIn particle resistor based impact sensor is prepared according to Example 1 except said colloidal solution of particles are drop cast directly on top of a copper RFID antenna which is on a rigid substrate and the ethanol allowed to evaporate away to form a trace with dimensions of about 3 mm×3 mm×0.1 mm. The EGaIn particle resistor and copper antenna are then encapsulated with a rigid dielectric and the rigid substrate is adhered adjacent to the fuze of a munition such that the RFID antenna is readable by an RFID reader outside of the munition. When an impact of sufficient magnitude strikes the munition, the EGaIn particles that comprise the resistor will rupture and release liquid metal that will electrically connect to the copper RFID antenna, effectively altering its RF response. An RFID reader will no longer be able to read the original RFID response.

Example 6 Method of Using an EGaIn Particle Resistor Based Impact Sensor for Monitoring Infrastructure An EGaIn particle resistor based impact sensor is prepared according to Example 1 and the rigid ceramic plate is adhered to a flat and rigid section of a building, such as a window or wall. Copper wire is pressed into each end of the EGaIn particle resistor so as to rupture particles in contact with the wire and create an electrical connection. The EGaIn particle resistor and adjacent copper wire are then encapsulated with a rigid dielectric. The remaining open ends of copper wire are then connected to a device which includes a power source and a blue-tooth antenna such that one open end of wire is between the power source and antenna and the other open end of wire is connected to the other side of the power source to create a circuit that bypasses said antenna. When an impact of sufficient magnitude, such as a ballistic impact, an explosion from a mortar, or a strike from a hard object, contacts the building close to the EGaIn particle resistor, the EGaIn particles that comprise the resistor will rupture and release liquid metal that will electrically connect the circuit that bypasses said antenna. Said antenna will stop transmitting as it is no longer powered.

Example 7 Method of Using an EGaIn Particle Resistor Based Impact Sensor for Shipping Containers An EGaIn particle resistor based impact sensor is prepared according to Example 1 and the rigid ceramic plate is adhered to a flat and rigid section of a shipping container. Copper wire is pressed into each end of the EGaIn particle resistor so as to rupture particles in contact with the wire and create an electrical connection. The EGaIn particle resistor and adjacent copper wire are then encapsulated with a rigid dielectric. The remaining open ends of copper wire are then connected to a power source with one open end and to a dormant microcontroller with another. When an impact of sufficient magnitude strikes the rigid section of the container to which the rigid ceramic plate containing an EGaIn particle resistor is attached, the EGaIn particles that comprise the resistor will rupture and release liquid metal that will electrically connect the power source to the dormant micro-controller. The dormant micro-controller will then wake up and record the time since activation.

Example 9 Method of Using an EGaIn Particle Resistor Based Impact Sensor for Automotive Monitoring An EGaIn particle resistor based impact sensor is prepared according to Example 1 and the rigid ceramic plate is adhered to a flat and rigid section of an automobile, such as a window or wall. Copper wire is pressed into each end of the EGaIn particle resistor so as to rupture particles in contact with the wire and create an electrical connection. The EGaIn particle resistor and adjacent copper wire are then encapsulated with a rigid dielectric. The remaining open ends of copper wire are then connected between a micro-controller and said automobile's CPU. When an impact of sufficient magnitude strikes the automobile close to the EGaIn particle resistor, the EGaIn particles that comprise the resistor will rupture and release liquid metal that will electrically complete the circuit to connect the micro-controller with the automobile's CPU. This will trigger a predetermined action to be taken by the CPU, such as setting off an alarm or triggering an emergency notification system.

Example 10 Method of Using an Array of EGaIn Particle Resistor Based Impact Sensors for Heat-Shield Panels An array of EGaIn particle resistor based impact sensors are prepared according to Example 1 except said colloidal solution of particles are drop cast directly on top of copper RFID antennas which are on the backside of heat-shield panels and are electrically connected to a unique microcontroller port such that each port corresponds to a single heat shield panel. The ethanol is allowed to evaporate away to form a trace with dimensions of about 3 mm×3 mm×0.05 mm. The EGaIn particle resistor and copper antenna are then encapsulated with a rigid dielectric. Powering a given electrical pathway through the micro-controller should elicit a readable response from an associated heat shield panel. When an impact of sufficient magnitude strikes a heat-shield panel, the EGaIn particles that comprise the resistor will rupture and release liquid metal that will electrically connect to the copper RFID antenna, effectively altering its RF response. Powering an electrical pathway that connects to the impacted heat-shield panel should no longer elicit a readable response.

Example 11 Production of 11-Phosphonoundecyl Acrylate Functionalized EGaIn Liquid Metal Encapsulates Gallium and Indium were combined to produce a eutectic liquid alloy of GaIn (14.2 atom % In, 85.8 atom % Ga). A total of 9 milligrams of the ligand 11-phosphonoundecyl acrylate was dissolved in 10 milliliters of ethanol (200 proof, anhydrous USP) and added to a 20 milliliters glass vial containing 200 milligrams of the GaIn alloy. The mixture was sonicated in an ultrasonic bath at 45° C. for two hours to produce GaIn particles having a number average diameter of about 3 microns. The resulting colloidal solution was centrifuged at 2600 RCF for 3 minutes and the supernatant was removed and replaced. This process was repeated three times, after which the particles were suspended in 4 milliliters of ethanol.

Example 12 Production of 12-Azidododecylphosphonic acid Functionalized EGaIn Liquid Metal Encapsulates To produce nanoscale EGaIn-based liquid metal encapsulates functionalized with 12-azidododecylphosphonic acid, a multi-functional ligand molecule, 0.1 milliliters of EGaIn (14.2 atom % In, 85.8 atom % Ga) was placed into a 20 milliliters, 28 millimeters outer diameter borosilicate glass scintillation vial containing 14.9 milliliters absolute ethanol. A 3 millimeters ultrasonic probe microtip driven by a Sonics and Materials, Inc. VCX500 ultrasonic processor was then immersed approximately half of the vial height into the ethanol. Parafilm was then used to seal the vial opening as completely as possible to minimize solvent loss during ultrasonication. Sonication was then carried out for two hours at an amplitude of 17% while the vial temperature was held constant at a temperature of 10° C. using a water bath to produce nanoscale EGaIn particles having a number average diameter of about 160 nanometers.

Following ultrasonication, the vial of EGaIn encapsulate suspension was removed from the ultrasonication apparatus and 17 milligrams of 12-azidododecylphosphonic acid was added to the vial. The vial was then sealed with its cap and placed into a bath sonicator held at a temperature of 45° C. and sonicated for 30 minutes to bond phosphonic acid ligands to the EGaIn particle surface. Following the ligand attachment step, excess ligands were removed from solution by a series of centrifugation and washing steps where the particle suspension was placed into a centrifugation tube and spun at 8229 RCF for 20 minutes, after which the supernatant is decanted and the encapsulate sediment is redispersed into a 3:1 (v:v) mixture of chlorobenzene:methanol. This process is repeated three times before a final redispersion of the encapsulate particles into 3:1 chlorobenzene:methanol.

Example 13 Production of (3-glycidyloxypropyl) triethoxysilane Functionalized EGaIn Liquid Metal Encapsulates (3-glycidyloxypropyl) triethoxysilane functionalized EGaIn liquid metal encapsulates were produced in the same way as 12-azidododecylphosphonic acid functionalized encapsulates, except, 1 milliliter of (3-glycidyloxypropyl) triethoxysilane was used per 10 milliliters of solvent and the particle suspension was stirred at ambient temperature for 16 hours after addition, rather than 30 minutes of bath sonication. Excess ligand was removed from solution by three centrifugation/wash steps at 8229 RCF for 20 minutes with chlorobenzene. The final particles produced in this manner were redispersed into chlorobenzene for later use.

Example 14 Production of 11-Mercaptoundecanoic acid Functionalized EGaIn Liquid Metal Encapsulates 11-mercaptoundecanoic acid functionalized particles were made by placing 0.1 milliliters of EGaIn liquid metal into a 20 milliliters, 28 millimeters outer diameter borosilicate scintillation vial. To this vial was added 14.9 milliliters of a 64 millimolar solution of 11-mercaptoundecanoic acid in absolute ethanol. A 3 millimeter ultrasonic probe microtip driven by a Sonics and Materials, Inc. VCX500 ultrasonic processor was then immersed approximately half of the vial height into the ethanol. Parafilm was then used to seal the vial opening as completely as possible to minimize solvent loss during ultrasonication. Sonication was then carried out for sixteen hours at an amplitude of 30% while the vial temperature was held constant at a temperature of 10° C. using a water bath to produce nanoscale EGaIn particles having a number average diameter of about 60 nanometers. Excess ligand was removed from solution by a series of centrifugation/redispersion steps in which the particle suspension was centrifuged at 8229 RCF for 30 minutes to sediment the particles, followed by redispersion in fresh absolute ethanol. These steps were repeated three times before a final redispersion into absolute ethanol. Particles produced in this manner had a number averaged diameter of about 60 nanometers and a gallium oxide shell thickness of about 1.2-1.3 nanometers.

Example 15 Production of 4-Aminophenyl propargyl ether Functionalized EGaIn-based Liquid Metal Encapsulates 4-Aminophenyl propargyl ether functionalized EGaIn particles are made as in Example 14 for EGaIn particles functionalized with 11-mercaptoundecanoic acid, except, 4-aminophenyl propargyl ether is substituted for 11-mercaptoundecanoic acid wherever 11-mercaptoundecanoic acid is used in the procedure.

Example 16 Production of 12-Azidododecylphosphonic acid Functionalized Ga—In—Sn Alloy Liquid Metal Encapsulates Ga—In—Sn alloy (68.5 wt % Ga, 21.5 wt % In, 10 wt % Sn) liquid metal particles functionalized with 12-azidododecylphosphonic acid are made as in Example 12 for EGaIn particles functionalized with 12-azidododecylphosphonic acid, except, Ga—In—Sn alloy (68.5 wt % Ga, 21.5 wt % In, 10 wt % Sn) liquid metal is substituted for EGaIn wherever EGaIn is used.

Example 17 Production of (3-glycidyloxypropyl) triethoxysilane Functionalized Ga—In—Sn Alloy Liquid Metal Encapsulates Ga—In—Sn alloy (68.5 wt % Ga, 21.5 wt % In, 10 wt % Sn) liquid metal particles functionalized with (3-glycidyloxypropyl) triethoxysilane are made as in Example 13 for EGaIn particles functionalized with (3-glycidyloxypropyl) triethoxysilane, except, Ga—In—Sn alloy (68.5 wt % Ga, 21.5 wt % In, 10 wt % Sn) liquid metal is substituted for EGaIn wherever EGaIn is used.

Example 18 Production of 11-Mercaptoundecanoic acid Functionalized Ga—In—Sn Alloy Liquid Metal Encapsulates Ga—In—Sn alloy (68.5 wt % Ga, 21.5 wt % In, 10 wt % Sn) liquid metal particles functionalized with 11-mercaptoundecanoic acid were made as in Example 14 for EGaIn particles functionalized with 11-mercaptoundecanoic acid, except, Ga—In—Sn alloy (68.5 wt % Ga, 21.5 wt % In, 10 wt % Sn) liquid metal is substituted for EGaIn wherever EGaIn is used.

Example 19 Production of 4-Aminophenyl propargyl ether Functionalized Ga—In—Sn Alloy Liquid Metal Encapsulates Ga—In—Sn alloy (68.5 wt % Ga, 21.5 wt % In, 10 wt % Sn) liquid metal particles functionalized with 4-aminophenyl propargyl ether are made as in Example 15 for EGaIn particles functionalized with 4-aminophenyl propargyl ether, except, Ga—In—Sn alloy (68.5 wt % Ga, 21.5 wt % In, 10 wt % Sn) liquid metal is substituted for EGaIn wherever EGaIn is used.

Example 20 Production of 12-Azidododecylphosphonic acid Functionalized Field's metal Liquid Metal Encapsulates Field's metal (32.5 wt % Bi, 51 wt % In, 16.5 wt % Sn) liquid metal particles functionalized with 12-azidododecylphosphonic acid are made as in Example 12 for EGaIn particles functionalized with 12-azidododecylphosphonic acid, except, Field's liquid metal alloy is substituted for EGaIn wherever EGaIn is used, the bath temperature for ultrasonication is held at 65° C., and ethylene glycol is used as solvent in place of ethanol.

Example 21 Production of (3-glycidyloxypropyl) triethoxysilane Functionalized Field's metal Liquid Metal Encapsulates Field's metal (32.5 wt % Bi, 51 wt % In, 16.5 wt % Sn) liquid metal particles functionalized with (3-glycidyloxypropyl) triethoxysilane are made as in Example 13 for EGaIn particles functionalized with (3-glycidyloxypropyl) triethoxysilane, except, Field's liquid metal alloy is substituted for EGaIn wherever EGaIn is used, the bath temperature for ultrasonication is held at 65° C., and ethylene glycol is used as solvent in place of ethanol.

Example 22 Production of 11-Mercaptoundecanoic acid Functionalized Field's metal Liquid Metal Encapsulates Field's metal (32.5 wt % Bi, 51 wt % In, 16.5 wt % Sn) liquid metal particles functionalized with 11-mercaptoundecanoic acid are made as in Example 14 for EGaIn particles functionalized with 11-mercaptoundecanoic acid, except, Field's liquid metal alloy is substituted for EGaIn wherever EGaIn is used, the bath temperature for ultrasonication is held at 65° C., and ethylene glycol is used as solvent in place of ethanol.

Example 23 Production of 4-Aminophenyl propargyl ether Functionalized Field's metal Liquid Metal Encapsulates Field's metal (32.5 wt % Bi, 51 wt % In, 16.5 wt % Sn) liquid metal particles functionalized with 4-aminophenyl propargyl ether are made as in Example 15 for EGaIn particles functionalized with 4-aminophenyl propargyl ether, except, Field's liquid metal alloy is substituted for EGaIn wherever EGaIn is used, the bath temperature for ultrasonication is held at 65° C., and ethylene glycol is used as solvent in place of ethanol.

Example 24 Production of Covalently-linked Triazole-containing Networks from 12-Azidododecylphosphonic acid Functionalized EGaIn Liquid Metal Encapsulates 12-Azidododecylphosphonic acid functionalized EGaIn liquid metal encapsulates are produced as described in Example 12. To this particle suspension is added 6.18 microliters of propargyl ether, followed by the addition of 2.4 milligrams sodium ascorbate and 1 milligram of copper (II) sulfate pentahydrate. This mixture is then pipetted onto a stretchable substrate and allowed to dry before activation of the electrical conductivity of the network via stretching.

Example 25 Production of 3-(Trimethoxysilyl)propyl Methacrylate Functionalized EGaIn Liquid Metal Encapsulates 3-(trimethoxysilyl)propyl methacrylate functionalized EGaIn liquid metal encapsulates were produced in the same way as Example 11, except, 1 milliliter of 3-(trimethoxysilyl)propyl methacrylate was used in place of 9 milligrams of 11-phosphonoundecyl acrylate.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of detecting an impact on a surface, said method comprising:
   a) measuring a change in a resistor's resistance or a change in a system triggered by said change in said resistor's resistance, said resistor comprising a plurality of encapsulates that comprise a liquid metal core, and a metal oxide shell that encapsulates said core, said change in said resistor's resistance being caused at least in part by a change in the momentum of at least a portion said plurality of encapsulates as a result of an impact; and b) using said change in said resistor's resistance and/or change in said system triggered by said change in said resistor's resistance as confirmation of said impact on said surface.

2. A method of detecting an impact according to claim 1 wherein said change in the resistance of said resistor is from about 0.00001 to about 15 orders of magnitude.

3. A method of detecting an impact according to claim 1 wherein said encapsulates are from about 5 nanometers to about 5 millimeters in diameter.

4. A method of detecting an impact according to claim 1 wherein said encapsulates have a shell thickness from about 0.5 nanometers to about 20 nanometers.

5. A method of detecting an impact according to claim 1 wherein said liquid metal core comprises a liquid metal selected from the group consisting of Hg, Pb, Sn, Sb, Cd, Bi, Ga, In, Al, Zn, Ag, Au, Tl and mixtures thereof.

6. A method of detecting an impact according to claim 1 wherein said liquid metal core comprises a liquid metal alloy selected from the group consisting of Ga/In, Ga/In/Sn, Ga/In/Sn/Sb, In/Sn/Bi, Bi/Pb/Sn, Bi/Pb/Sn/Cd, Bi/Pb/Sn/Cd/In and mixtures thereof.

7. A method of detecting an impact according to claim 1 wherein said shell comprises a metal oxide comprising a cation derived from a metal selected from the group consisting of Ga, In, Sn, Pb, Sb, Cd, Al, Zn, Tl, Bi, Ca, Sc, Ti, V, Cr, Sr, Y, Zr, Nb, Mo, Te, Gd, Hf, Pr, Nd, Pt, Sm, Eu, Dy, Ho, Er, Yb and mixtures thereof.

8. A method of detecting an impact according to claim 1 wherein said encapsulates comprise one or more ligands covalently or coordinatively bound to said shell's external surface.

9. A method of detecting an impact according to claim 1 wherein said resistor is a component of said system.

10. A method of detecting an impact according to claim 1 wherein said resistor is selected from the group consisting of:
a) a resistor comprising a composite comprising a matrix material and said plurality of encapsulates that comprise a liquid metal core, and a metal oxide shell that encapsulates said core, said encapsulates being embedded in said matrix material;
b) a resistor that is encapsulated with a protective material;
c) a resistor wherein one or more of said encapsulates are covalently bound to a matrix material through one or more ligands which are covalently or coordinatively bound to said encapsulates' shell's external surface;
d) a resistor wherein one or more of said encapsulates are chemically bound via a linkage comprising the ligands of said encapsulates to the external shell of an encapsulate other than the external shell of the encapsulate to which said ligand was originally covalently bound.

11. A method of detecting an impact according to claim 1 wherein said change in said system triggered by said change in said resistor's resistance is a change in voltage, resistance, current, impedance, and/or capacitance.

12. A method of detecting an impact according to claim 1 wherein said system comprises an antenna, a transmission line, a wave guide, an optical coating and/or a frequency selective surface.

13. A method of detecting an impact according to claim 1 wherein said resistor releases a charge in response to said impact.

14. An article comprising a resistor, said resistor comprising a plurality of encapsulates that comprise a liquid metal core, and a metal oxide shell that encapsulates said core, said encapsulates comprising one or more ligands covalently or coordinatively bound to said shell's external surface, said ligands comprising a head group that comprises a material selected from the group consisting of thiols, amines, phosphonic acids, alkoxysilanes, halosilanes, carboxylic acids, nitriles, and mixtures thereof.

15. An article according to claim 14, wherein said resistor is selected from the group consisting of:
a) a resistor comprising a composite comprising a matrix material and said plurality of encapsulates that comprise a liquid metal core, and a metal oxide shell that encapsulates said core, said encapsulates being embedded in said matrix material;
b) a resistor wherein one or more of said encapsulates are covalently bound to a matrix material through one or more ligands which are covalently or coordinatively bound to said encapsulates' shell's external surface; or
c) a resistor wherein one or more of said encapsulates are chemically bound via a linkage comprising the ligands of said encapsulates to the external shell of an encapsulate other than the external shell of the encapsulate to which said ligand was originally covalently bound.

16. An article according to claim 14, said article being an RFID device, a time recording device, a Bluetooth communication device, a location mapped device, or a fuze.

17. An article according to any of claim 14, said article comprising a power source.

18. An article comprising a resistor, a power source, a communication module and a rigid surface; wherein said resistor comprises a plurality of encapsulates that comprise a liquid metal core, and a metal oxide shell that encapsulates said core, and wherein at least one of the elements in the group comprising said power source and said communication module in addition to said resistor are affixed to said rigid surface.

19. An article according to claim 18, said article being an RFID device, a time recording device, a Bluetooth communication device, a location mapped device, or a fuze.

20. An article according to claim 18 wherein said rigid surface is conformally applied to another surface before rigidifying.

21. An article according to claim 18 said article comprising a CPU, an adhesive, a container, or an encapsulate.

* * * * *